(12) United States Patent
Nakagawa et al.

(10) Patent No.: US 6,493,857 B1
(45) Date of Patent: Dec. 10, 2002

(54) MATCHING CIRCUIT PARTS BETWEEN CIRCUITRY-RELATED DOCUMENTS

(75) Inventors: Takuro Nakagawa, Kawasaki (JP); Kooji Kataoka, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/465,007

(22) Filed: Dec. 16, 1999

(30) Foreign Application Priority Data

Dec. 28, 1998 (JP) ............................. 10-373602

(51) Int. Cl.$^7$ ............................. G06F 9/455
(52) U.S. Cl. ................. 716/11; 716/8; 716/9; 716/10
(58) Field of Search ......................... 716/1–18; 707/4, 707/8, 7, 10, 100, 200, 201, 203, 104.1, 101–102, 204; 705/29, 400; 700/100

(56) References Cited

U.S. PATENT DOCUMENTS 5,864,875 A * 1/1999 Van Huben et al. ........ 707/200

* cited by examiner

*Primary Examiner*—Vuthe Siek
*Assistant Examiner*—Naum Levin
(74) *Attorney, Agent, or Firm*—Staas & Halsey LLP

(57) ABSTRACT

A device for matching information between a plurality of circuitry-related documents includes a tree generation unit which generates a tree that represents relations between the circuitry-related documents, a matching-mask storage unit which stores a matching mask that specifies matching objects, and a matching unit which matches the matching objects between the circuitry-related documents within a specified range in the tree.

15 Claims, 13 Drawing Sheets

FIG.3A

| PART TYPE | PARAMETER | RATING | SIZE | THERMAL CHARACTERISTIC |
|---|---|---|---|---|
| R (RESISTOR) | ◎ | | | |
| C (CAPACITOR) | ◎ | | ○ | |
| LSI | | ◎ | ○ | ◎ |

FIG.3B

| PART TYPE | ITEM | LEVEL OF SIGNIFICANCE |
|---|---|---|
| R | PARAMETER | ERROR |
| C | PARAMETER | ERROR |
| C | SIZE | WARNING |
| LSI | VOLTAGE | ERROR |
| LSI | SIZE | WARNING |
| LSI | HEAT | ERROR |

LIST OF DIFFERENCES

ELEMENT NUMBER: A001

| ELEMENT NAME | BILL OF MATERIAL AS REFERENCE | CIRCUIT DIAGRAM AS REFERENCE | PRINT-CIRCUIT-BOARD DIAGRAM AS REFERENCE | | | | |
|---|---|---|---|---|---|---|---|
| | AREA STANDARD | REF | OBJECT DIAGRAM | DIFFERENCE | STATUS | REFERENCE INFORMATION | OBJECT INFORMATION |
| A002 | US | IC01 | CIRCUIT DIAGRAM | ADD | ERROR | | |
| A002 | US | IC02 | PRINT-CIRCUIT-BOARD DIAGRAM | ADD | ERROR | | |
| A003 | STANDARD | TR01 | CIRCUIT DIAGRAM | DELETE | ERROR | | |
| A003 | STANDARD | TR01 | PRINT-CIRCUIT-BOARD DIAGRAM | DELETE | ERROR | | |
| A004 | STANDARD | R001 | CIRCUIT DIAGRAM | RATING | WARNING | 10Ω | 30Ω |
| A004 | STANDARD | R002 | CIRCUIT DIAGRAM | RATING | WARNING | 100Ω | 120Ω |

[STORE FILE] [FINISH]

DESCRIPTION:
 AREA STANDARD······STANDARD OF AREA WHERE PRODUCT IS MARKETED
 REF······PART REFERENCE
 OBJECT DIAGRAM······NAME OF DIAGRAM IN WHICH DIFFERENCES ARE FOUND
 DIFFERENCE······TYPE OF DIFFERENCE
 REFERENCE INFORMATION······PART PARAMETER OF REFERENCE DIAGRAM
 OBJECT INFORMATION······PART PARAMETER OF OBJECT DIAGRAM

MATCHING CIRCUIT PARTS BETWEEN CIRCUITRY-RELATED DOCUMENTS

BACKGROUND OF THE INVENTION

1. Field of the Invention

The present invention relates to a method, a device, and a memory medium having a program recorded therein for matching parts between a circuit diagram, a print-circuit-board diagram, and a bill of material.

2. Description of the Related Art

When a product having an electrical circuit therein is designed, a circuit diagram is created first based on a circuit design, and, then, a print-circuit-board diagram is created by arranging circuit parts on a board based on a print-circuit-board design. In a separate form, sizes and specifics of the circuit parts are specified in a bill of material.

Since the circuit diagram, the print-circuit-board diagram, and the bill of material are produced separately, it is conventionally an incumbent on the design engineers to check the diagrams and the table so as to make sure that there is no inconsistency therebetween. Such a check process requires excessive time and labor.

Accordingly, there is a need for a scheme which can match parts between a circuit diagram, a print-circuit-board diagram, and a bill of material so as to check consistency therebetween.

SUMMARY OF THE INVENTION

Accordingly, it is a general object of the present invention to provide a scheme which can satisfy the need described above.

It is another and more specific object of the present invention to provide a method, a device, and a memory medium having a program embodied therein for matching parts between a circuit diagram, a print-circuit-board diagram, and a bill of material so as to check consistency therebetween.

In order to achieve the above objects according to the present invention, a device for matching information between a plurality of circuitry-related documents includes a tree generation unit which generates a tree that represents relations between the circuitry-related documents, a matching-mask storage unit which stores a matching mask that specifies matching objects, and a matching unit which matches the matching objects between the circuitry-related documents within a specified range in the tree.

According to the present invention, the device as described above is such that the circuitry-related documents include a circuit diagram, a print-circuit-board diagram, and a bill of material.

Moreover, a method and a memory medium having a program embodied therein for matching parts between a circuit diagram, a print-circuit-board diagram, and a bill of material are achieved in a like manner as the device described above is achieved.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
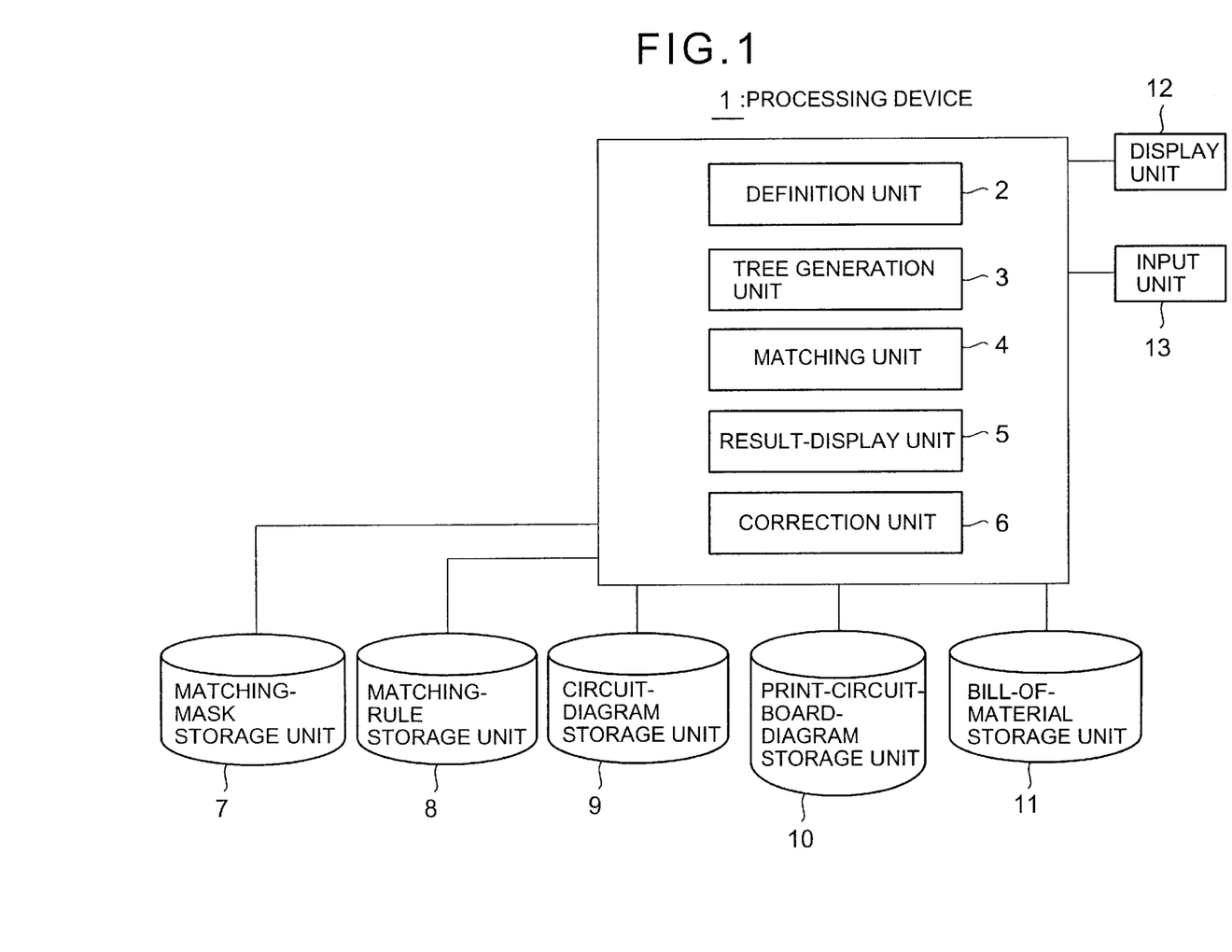
FIG. 1 is a block diagram of a system according to the present invention.

FIG. 1 is a block diagram of a system according to the present invention.

A processing device 1 of FIG. 1 executes a program after loading the program from a memory medium (not shown) to a main memory, and attends to various processes which will described below in detail. The processing device 1 includes a definition unit 2, a tree generation unit 3, a matching unit 4, a result-display unit 5, and a correction unit 6.

The definition unit 2 is used for defining a matching mask stored in a matching-mask storage unit 7 and matching rules stored in a matching-rule storage unit 8.

The tree generation unit 3 generates a tree that represents relations between a circuit diagram, a print-circuit-board diagram, and a bill of material.

The matching unit 4 extracts information from a circuit diagram, a print-circuit-board diagram, and a bill of material with respect to matching objects registered in the matching mask of the matching-mask storage unit 7, and attends to matching of the extracted information. This process by the matching unit 4 is performed with respect to a range relating to a node indicated in a tree representation.

The result-display unit 5 displays results of the matching performed by the matching unit 4 on a display unit 12.

The correction unit 6 is activated upon correction of a node indicated as having inconsistency on the display unit 12 so as to have matching results displayed again after another matching process.

The matching-mask storage unit 7 stores a matching mask, which defines matching objects.

The matching-rule storage unit 8 stores matching rules, which define items of the matching objects, and, also, define levels of significance of respective items indicating how serious the inconsistencies of respective items are.

The circuit-diagram storage unit 9 stores a circuit diagram of a given product.

The print-circuit-board-diagram storage unit 10 stores a print-circuit-board diagram, which defines an arrangement of circuit parts included in the circuit diagram. Here, the print-circuit-board diagram may be comprised of more than one print-circuit-board diagrams when the circuit is implemented on more than one print circuit board.

The bill-of-material storage unit 11 stores a bill of material, which specifies device names, parameters, ratings, sizes, thermal characteristics, etc.

The display unit 12 displays various information necessary for the operation of the system.

The input unit 13 includes a keyboard and a mouse, for example, and is used for entering various data and commands.

Figure 2:
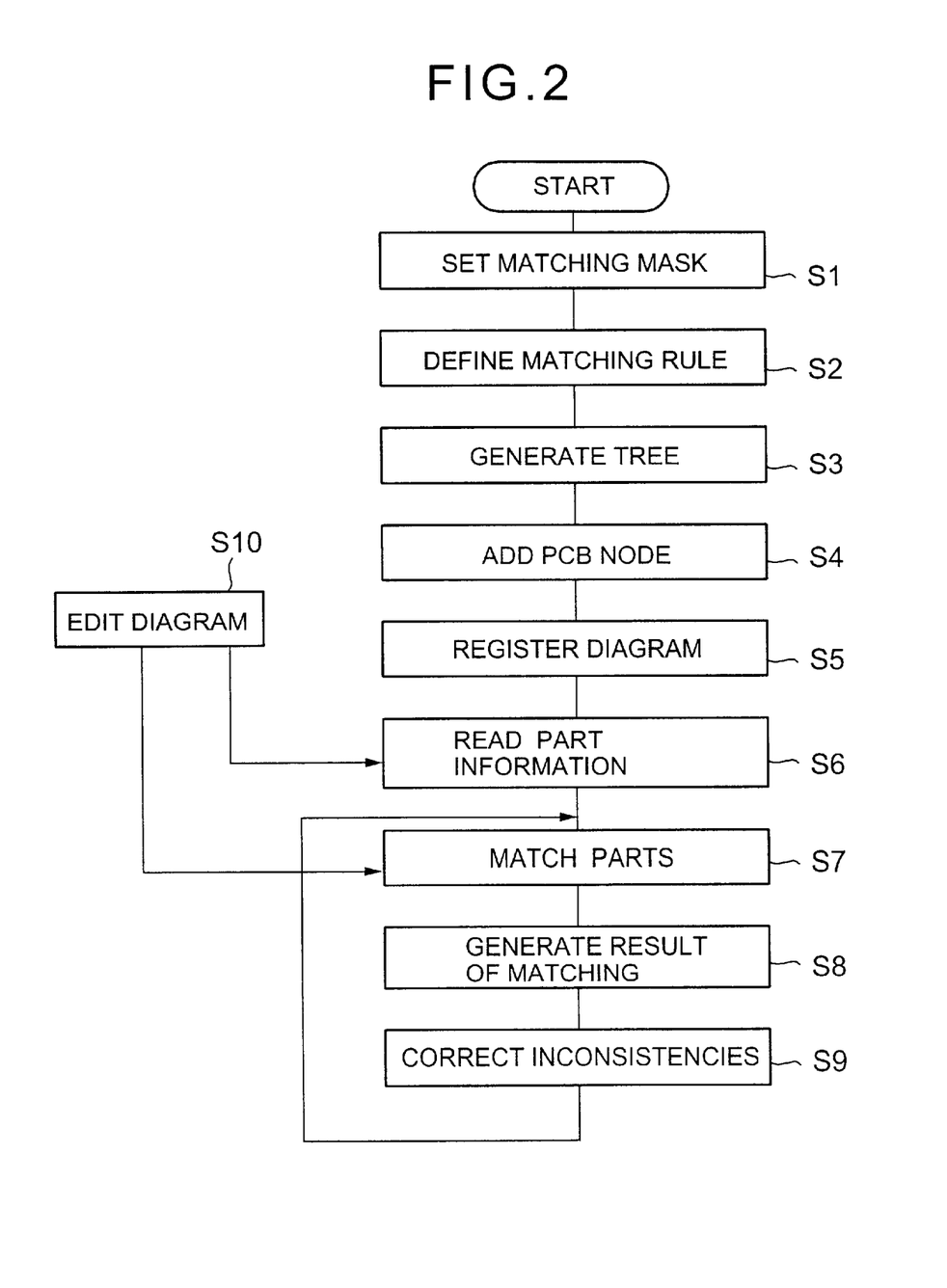
FIG. 2 is a flowchart of a process performed by the system of FIG. 1.

FIG. 2 is a flowchart of a process performed by the system of FIG. 1.

At a step S1, a matching mask is defined. The matching mask specifies matching objects to be subjected to a matching process, so that other objects not listed in the matching mask are excluded from the matching process. The matching mask will be described later in connection with FIG. 4 and FIG. 5B.

At a step S2, matching rules are defined. Matching rules specify items to be subjected to a matching process where the items are defined with respect to each matching object. For example, when a resistor is a matching object, an item "resistance" is defined as an item to be subjected to the matching process. The matching rules will be described later in detail in connection with FIGS. 3A and 3B.

At a step S3, a tree is generated. There are three types of trees. A first type is a tree that only consists of a matching-process element. A second type is a tree that includes a plurality of print-circuit-board diagrams for one circuit diagram. A third type is a tree that includes a plurality of circuit diagrams for one print-circuit-board diagram. These trees will be described later in detail in connection with FIGS. 6A through 6C.

Figure 7A:
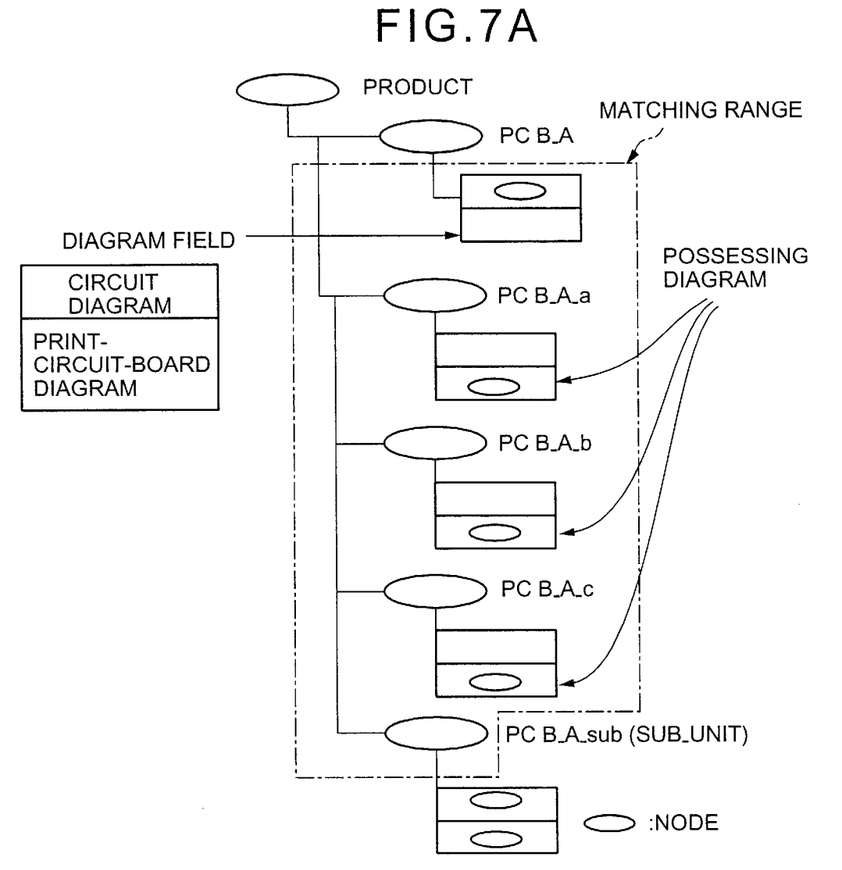
FIGS. 7A and 7B are illustrative drawings for explaining a tree structure.
Figure 7B:
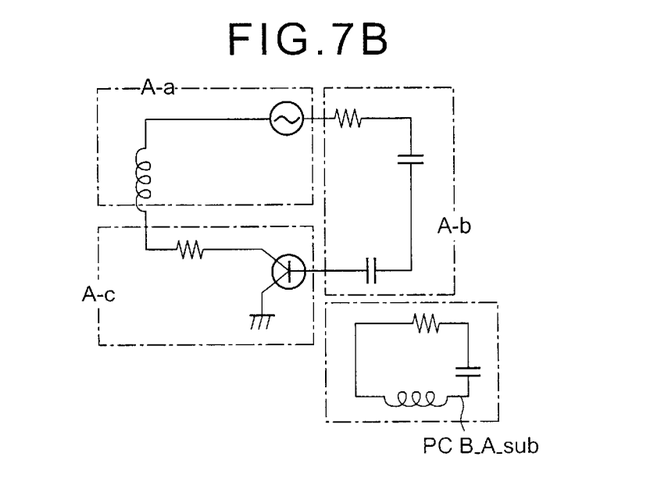

At a step S4, PCB (print circuit board) nodes re added. This will be later described in detail in connection with FIGS. 7A and 7B. As shown in FIG. 7A, for example, PCB nodes having a circuit diagram shown in FIG. 7B are added as nodes (PCB-A-a, PCB-A-b, and the like) to the tree generated at the step S4.

At a step S5, diagrams are registered to the PCB nodes added at the step S4. Each unit which has both a circuit diagram and a print-circuit-board diagram after the steps S4 and S5 will be treated as a matching unit. That is, such a unit will be treated as that which falls within a matching range.

At a step S6, part information is read.

At a step S7, a matching process is performed. This process matches items of matching objects according to the matching rules of the matching-rule storage unit 8 with respect to the matching objects selected by the matching mask of the matching-mask storage unit 7. This matching process is performed on the part information falling within the matching range. The matching process will be later described in detail in connection with FIG. 9.

At a step S8, a matching list (i.e., results of the matching process performed at the step S7) is produced.

At a step S9, corrections are made to the bill of material. This is done by a user who corrects inconsistencies of parts after spotting the inconsistencies having enhanced appearances on the displayed tree. Such corrections may include, for example, replacement of old parts failing to meet the required standards to new parts that satisfy the required standards. The steps S7 through S9 are repeated as many times as necessary to insure that no inconsistency exists between the circuit diagram, the print-circuit-board diagram, and the bill of material.

A step S10 indicates editing of diagrams. Design changes or correction of inconsistencies may be incorporated into the diagrams through this editing process, and, then, the matching process is performed by starting from the step S6 or the step S7. This enables checking of edited diagrams.

As described above, a matching mask and matching rules are defined, and a tree of a given product is automatically generated from a circuit diagram, a print-circuit-board diagram, and a bill of material. Then, PCB nodes are added, and diagrams are registered. Thereafter, the matching process is performed, and results of the matching process are shown on the display by providing enhanced appearances for the inconsistencies. After corrections are made to the inconsistencies, the matching process is performed again. In this manner, the present invention checks inconsistency between the circuit diagram, the print-circuit-board diagram, and the bill of material, and displays a list of inconsistencies to prompt appropriate corrections.

In the following, a detailed description of the present invention will be given.

Figure 3A:
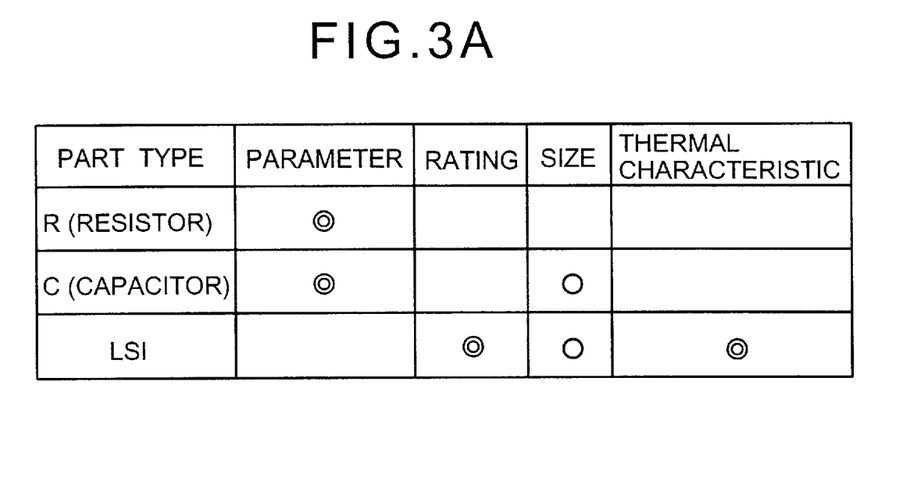
FIGS. 3A and 3B are illustrative drawings for explaining matching rules.
Figure 3B:
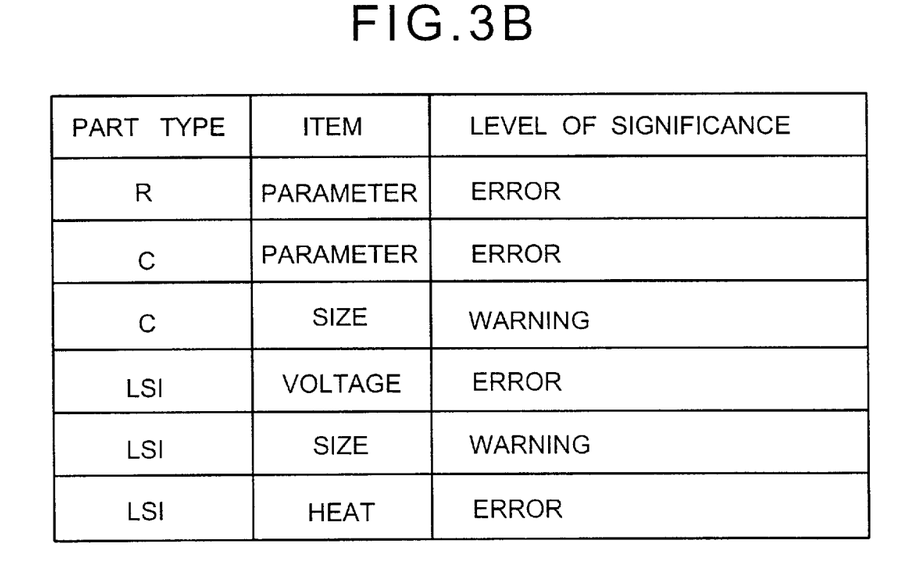

FIGS. 3A and 3B are illustrative drawings for explaining matching rules.

FIG. 3A shows an example of a display window for setting matching rules. In this example, the matching-rule setting window shows part types and items (i.e., device parameters, ratings, a size, thermal characteristics, and the like) of each part type in a table format. A symbol of two concentric circles indicates that a corresponding item of a matching object is an important item, and inconsistency of this item is regarded as an error-level inconsistency. A symbol of a single circle indicates that a corresponding item of a matching object needs to be checked despite its secondary importance, and inconsistency of this item is regarded as a warning-level inconsistency.

FIG. 3B shows matching rules. The matching rules are provided in a table format, which lists part types, items, and levels of significance of inconsistency.

In this manner, matching rules are defined and stored in the matching-rule storage unit 8. Then, the matching process is performed on the items defined in the matching rules with respect to the matching objects selected by the matching mask. If the matching process finds an inconsistency for a given part, the given part will be shown with an indication of an error status or a warning status.

Figure 4:
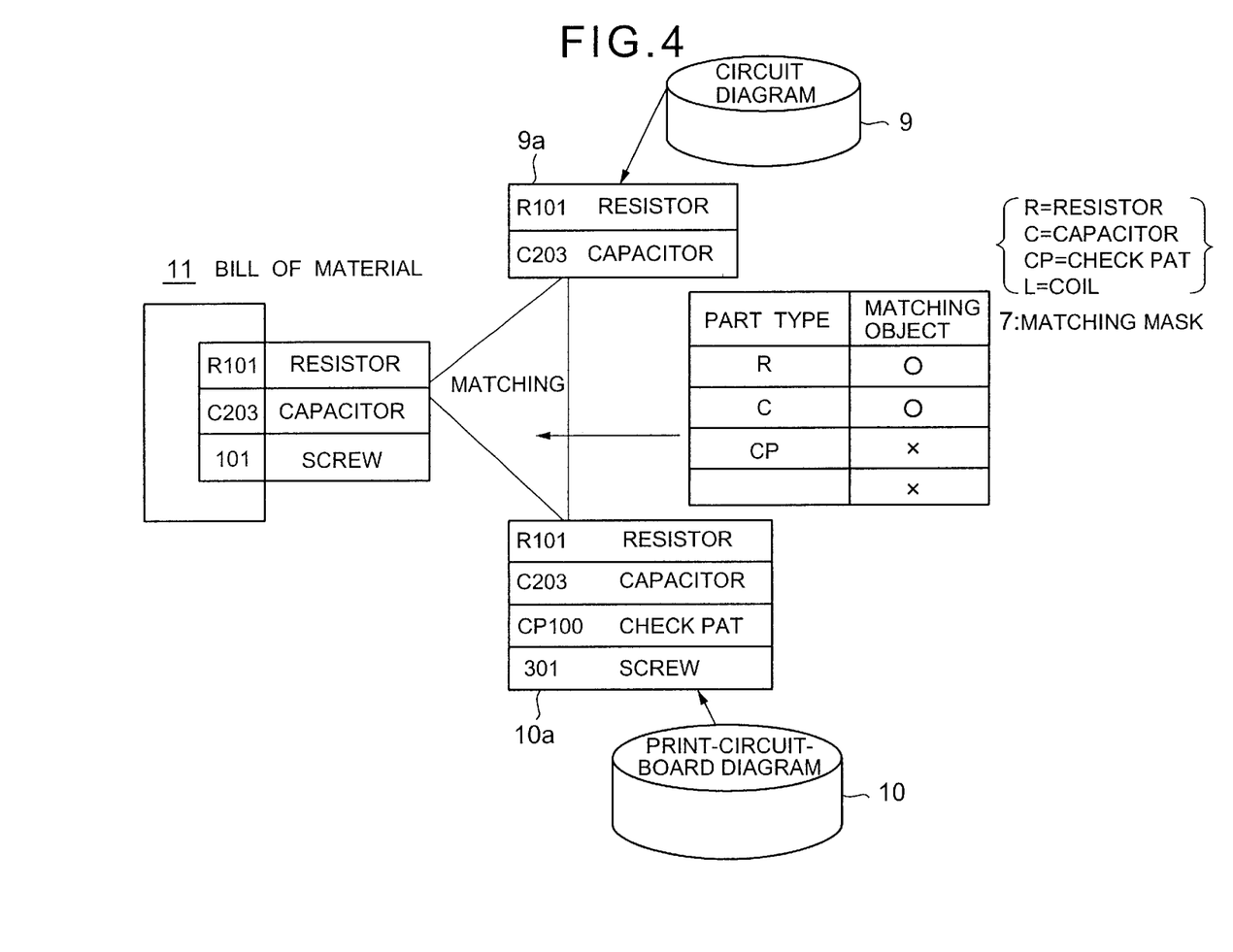
FIG. 4 is an illustrative drawing schematically showing a matching process of the present invention.

FIG. 4 is an illustrative drawing schematically showing a matching process of the present invention.

As shown in FIG. 4, a bill of material stored in the bill-of-material storage unit 11 lists paired part reference symbols and part types where the pairs correspond to respective parts.

A matching mask stored in the matching-mask storage unit 7 defines whether a given part type is a matching object to be subjected to matching. In FIG. 4, for example, a part type "R"(resistor) is indicated as a matching object.

Components 9a are defined by part reference symbols of respective parts included in a circuit diagram stored in the circuit-diagram storage unit 9.

Components 10a are defined by part reference symbols of respective parts included in a print-circuit-board diagram stored in the print-circuit-board-diagram storage unit 10.

The matching process is performed between the parts of the bill of material, the parts 9a of the circuit diagram, and the parts 10a of the print-circuit-board diagram by using the parts of the bill of material as a reference. In doing so, parts that are defined as matching objects in the matching ask are subjected to the matching process, and only the items defined in the matching rules are checked.

In this manner, the items defined in the matching rules are matched between the bill of material, the circuit diagram, and the print-circuit-board diagram only with respect to the parts defined as matching objects in the matching mask. If inconsistency is found, an appropriate indication of either an error or a warning is shown as defined in the matching rules. Namely, use of the matching mask and the matching rules makes it possible to automatically match relevant parts between the bill of material, the circuit diagram, and the print-circuit-board diagram so as to present inconsistencies with enhanced appearances indicative of either an error or a warning.

Figure 5A:
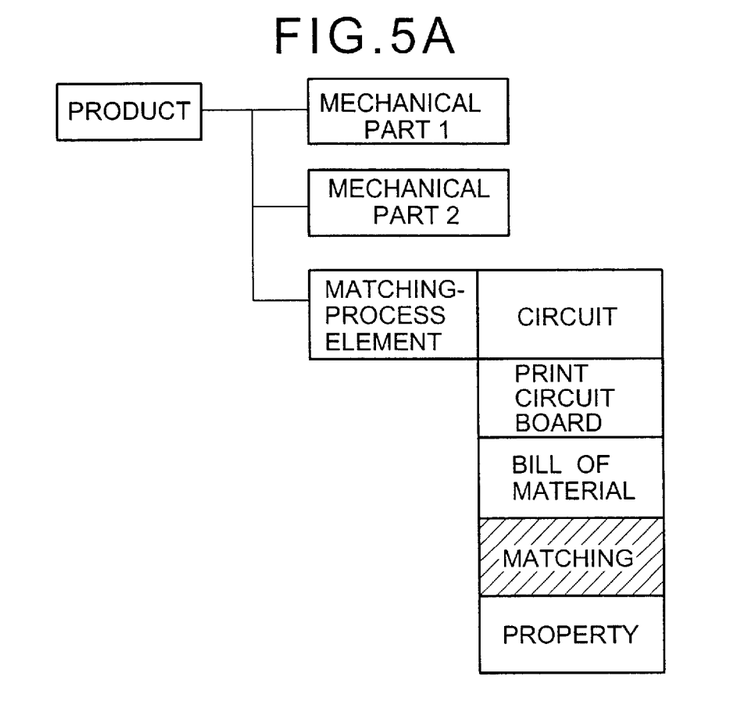
FIGS. 5A and 5B are illustrative drawings for explaining matching objects.
Figure 5B:
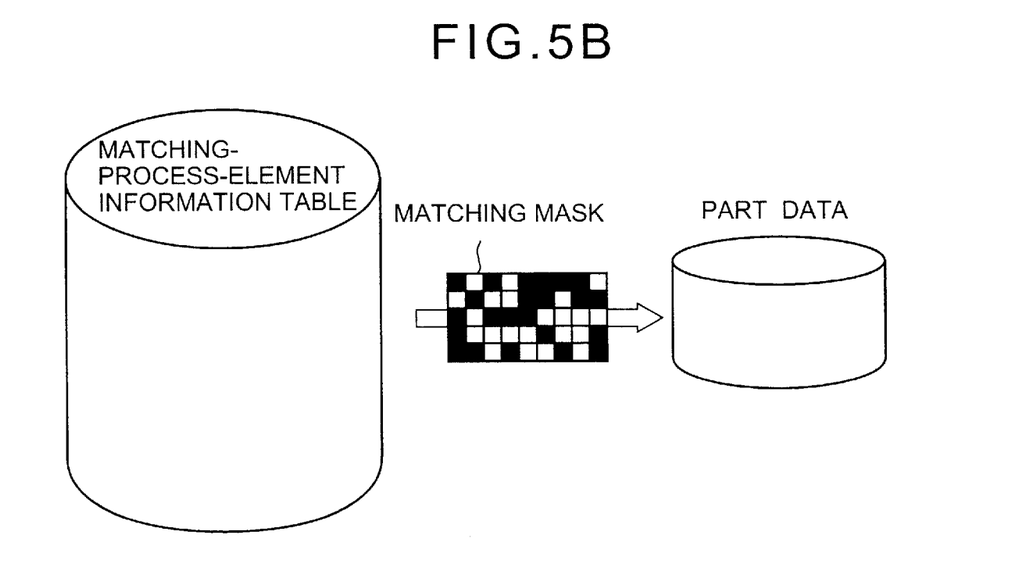

FIGS. 5A and 5B are illustrative drawings for explaining matching objects.

FIG. 5A shows an example of a menu window. When matching is selected from the menu, the matching process is activated and performed as described in connection with FIG. 4.

FIG. 5B shows the way the matching objects are extracted from a matching-process-element information table in accordance with a matching mask so as to produce part data that is to be subjected to the matching process. In FIG. 5B, mask bits of the matching mask are schematically shown as black dots and white dots. Component data corresponding to white-dot mask bits, for example, are extracted and treated as matching objects.

In this manner, use of the matching mask makes it possible to automatically extract matching objects from the part-information table to produce part data that is to be subjected to the matching process.

Figures 6A, 6B, 6C:
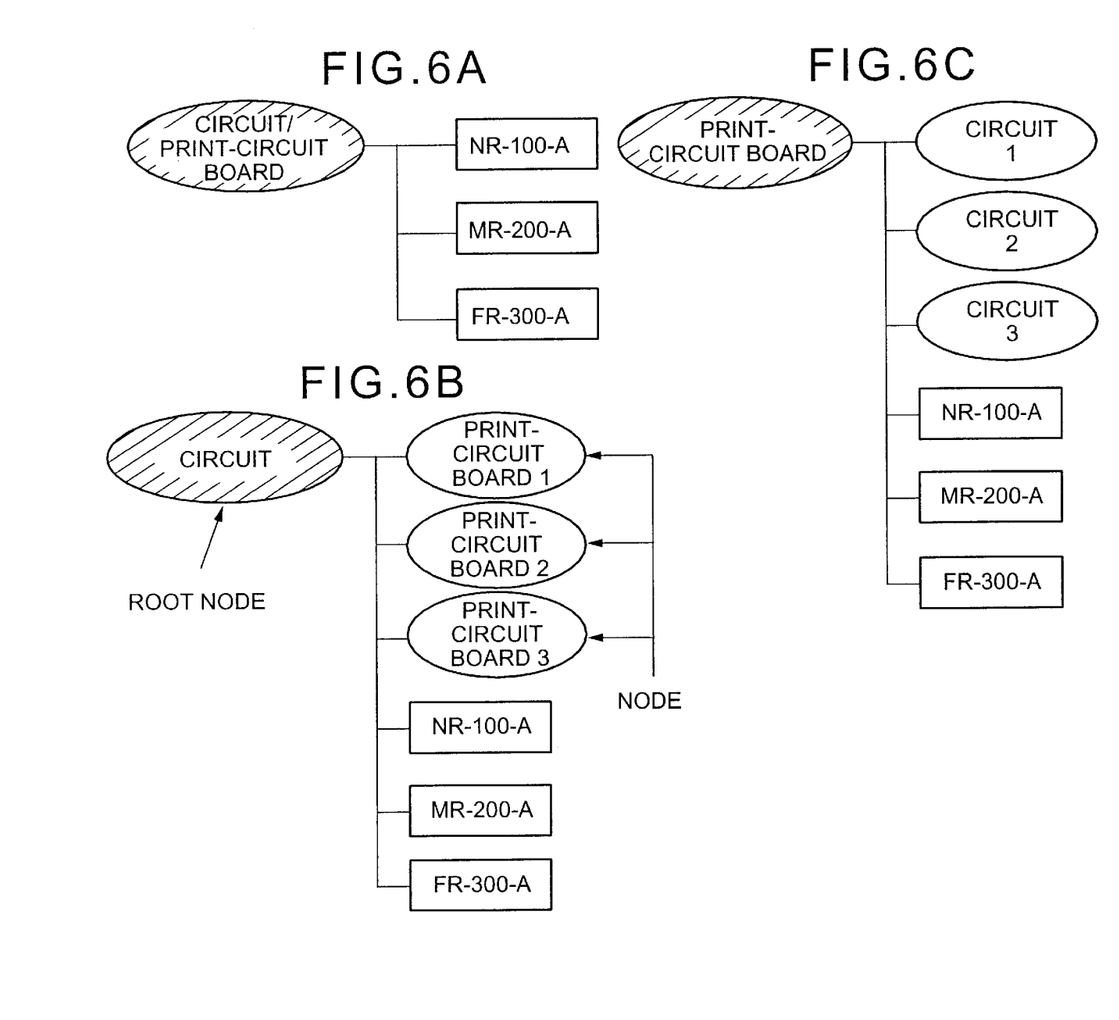
FIGS. 6A through 6C are illustrative drawings showing examples of different types of trees.

FIGS. 6A through 6C are illustrative drawings showing examples of different types of trees. As previously described, a tree generated at the step S3 of FIG. 2 matches one of the three tree types shown in FIGS. 6A through 6C.

FIG. 6A shows a first tree type. The first tree type includes only a matching-process element that can be subjected to a matching process, and does not include a non-matching-process element that cannot be subjected to a matching process. As shown in FIG. 6A, the matching-process element is represented as a node that corresponds to a circuit diagram and a print-circuit-board diagram, and parts are associated with the node.

FIG. 6B shows a second tree type. The second tree type is directed to a case in which a plurality of print circuit boards are used for implementing a single circuit. As shown in FIG. 6B, three nodes representing the respective print circuit boards are non-matching-process elements, and are associated with a root node representing the circuit. Further, parts are also associated with the root node.

FIG. 6C shows a third tree type. The third tree type is directed to a case in which a plurality of circuits are laid out on a single print circuit board. As shown in FIG. 6B, three nodes representing the respective circuits are non-matching-process elements, and are associated with a root node representing the print circuit boards. Further, parts are also associated with the root node.

In this manner, a tree of an appropriate type, selected from the three tree types, is generated depending on a product. In the generated tree, a set of tree elements which is self-contained in such a sense as all circuit diagrams and print-circuit-board diagrams necessary for a complete circuitry are contained therein is defined as a matching range, which serves as a unit of the matching process.

FIGS. 7A and 7B are illustrative drawings for explaining a tree structure.

FIG. 7A shows an example of a tree. In this tree, a root node represents a circuit diagram, and other nodes represent print circuit boards. A portion of the tree that is enclosed in dotted lines constitutes a matching range. Each node is provided with two diagram fields. An upper diagram field represents a circuit diagram, and a lower diagram field represents a print-circuit-board diagram. An elongated circle inside a diagram field indicates that a corresponding diagram exists in that node.

FIG. 7B shows diagrams corresponding to the tree structure shown in FIG. 7A. Here, diagrams A-a, A-b, A-c, and PCB-A-sub are in the possession of respective nodes having corresponding reference symbols in FIG. 7A. For example, the diagram A-a of FIG. 7B is owned by the node PCB-A-a of FIG. 7A.

Figure 8:
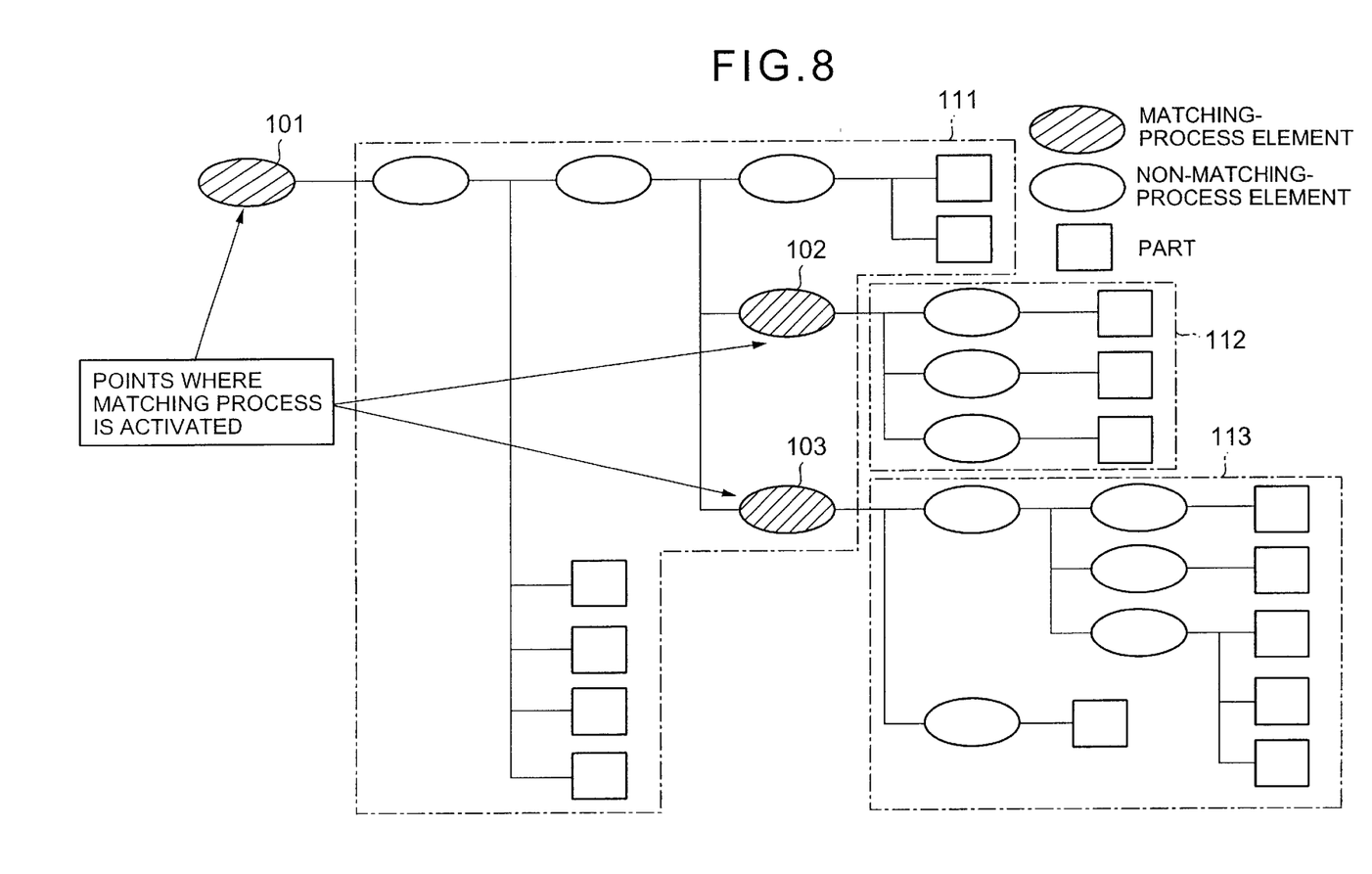
FIG. 8 is an illustrative drawing for explaining a matching range.

FIG. 8 is an illustrative drawing for explaining a matching range.

The matching process is performed on diagrams and parts included in the matching range. When a node 101 is selected, for example, a matching range 111 is defined based on the selection of the node 101. By the same token, when a node 102 or 103 is selected, a matching range 112 or 113 is defined, respectively, based on the selection of the node.

Namely, when a node is selected, the selection of the node entails a selection of a matching range. That is, the matching range is defined as a range of tree elements that is self-contained in such a sense as all the necessary circuit diagrams and print-circuit-board diagrams are contained therein. Then, a matching process is performed within the matching range, producing results indicating inconsistencies and presenting the inconsistencies with enhanced appearances. Such presentation of inconsistencies prompts corrections thereof.

Figure 9:
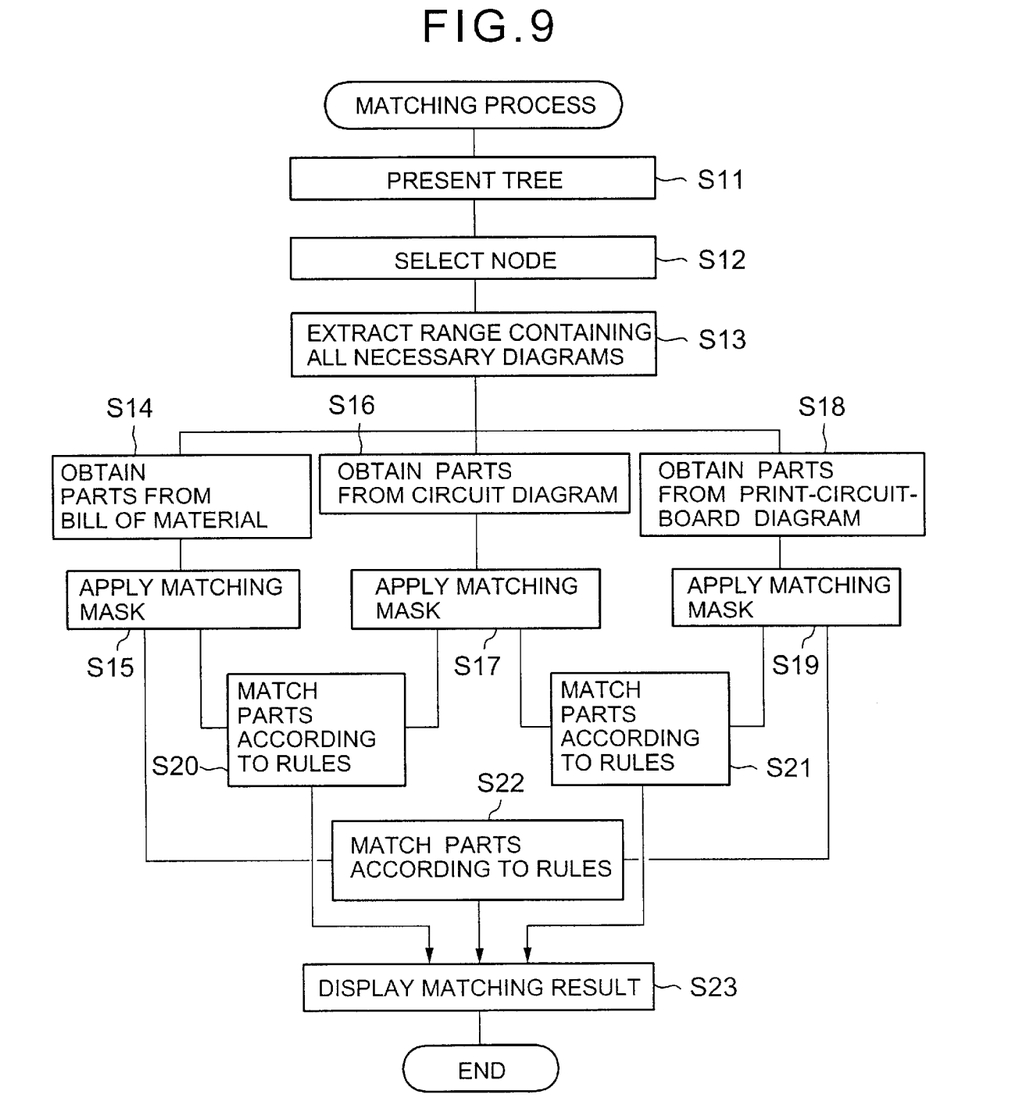
FIG. 9 is a flowchart of a matching process according to the present invention.

FIG. 9 is a flowchart of a matching process according to the present invention.

At a step S11, a tree to be subjected to a matching process is displayed.

At a step S12, a matching-target node is selected.

At a step S13, a range which contains all diagrams necessary for a complete circuitry therein is determined. For example, if the node 101 is selected in FIG. 8, the matching range 111 will be determined as a range having all the necessary circuit and print-circuit-board diagrams.

At a step S14, a list of parts is extracted from a bill of material.

At a step S15, a matching mask is applied to the list of parts. This process extracts parts of the bill of material that are defined as matching objects in the matching mask stored in the matching-mask storage unit 7.

At a step S16, a list of parts is extracted from a circuit diagram.

At a step S17, the matching mask is applied to the list of parts. This process extracts parts of the circuit diagram that are defined as matching objects in the matching mask stored in the matching-mask storage unit 7.

At a step S18, a list of parts is extracted from a print-circuit-board diagram.

At a step S19, the matching mask is applied to the list of parts. This process extracts parts of the print-circuit-board diagram that are defined as matching objects in the matching mask stored in the matching-mask storage unit 7.

At a step S20, the parts extracted at the step S15 and the parts extracted at the step S17 are matched according to the matching rules stored in the matching-rule storage unit 8.

At a step S21, the parts extracted at the step S17 and the parts extracted at the step S19 are matched according to the matching rules stored in the matching-rule storage unit 8.

At a step S22, the parts extracted at the step S15 and the parts extracted at the step S19 are matched according to the matching rules stored in the matching-rule storage unit 8.

At a step S23, results of the matching processes performed at the steps S20 through S22 are displayed. Namely, as will be described in connection with FIG. 11, inconsistencies are displayed by using the bill of material, the circuit diagram, or the print-circuit-board diagram as a reference.

In this manner, a tree of a product to be subjected to a matching process is displayed as shown in FIG. 8, and a node is selected to define a matching range in which all diagrams necessary for a complete circuitry are contained. Then, parts are matched between the bill of material, the circuit diagram, and the print-circuit-board diagram within the matching range. Results of the matching process are shown by presenting inconsistent parts with enhanced appearances, for example.

Figure 10:
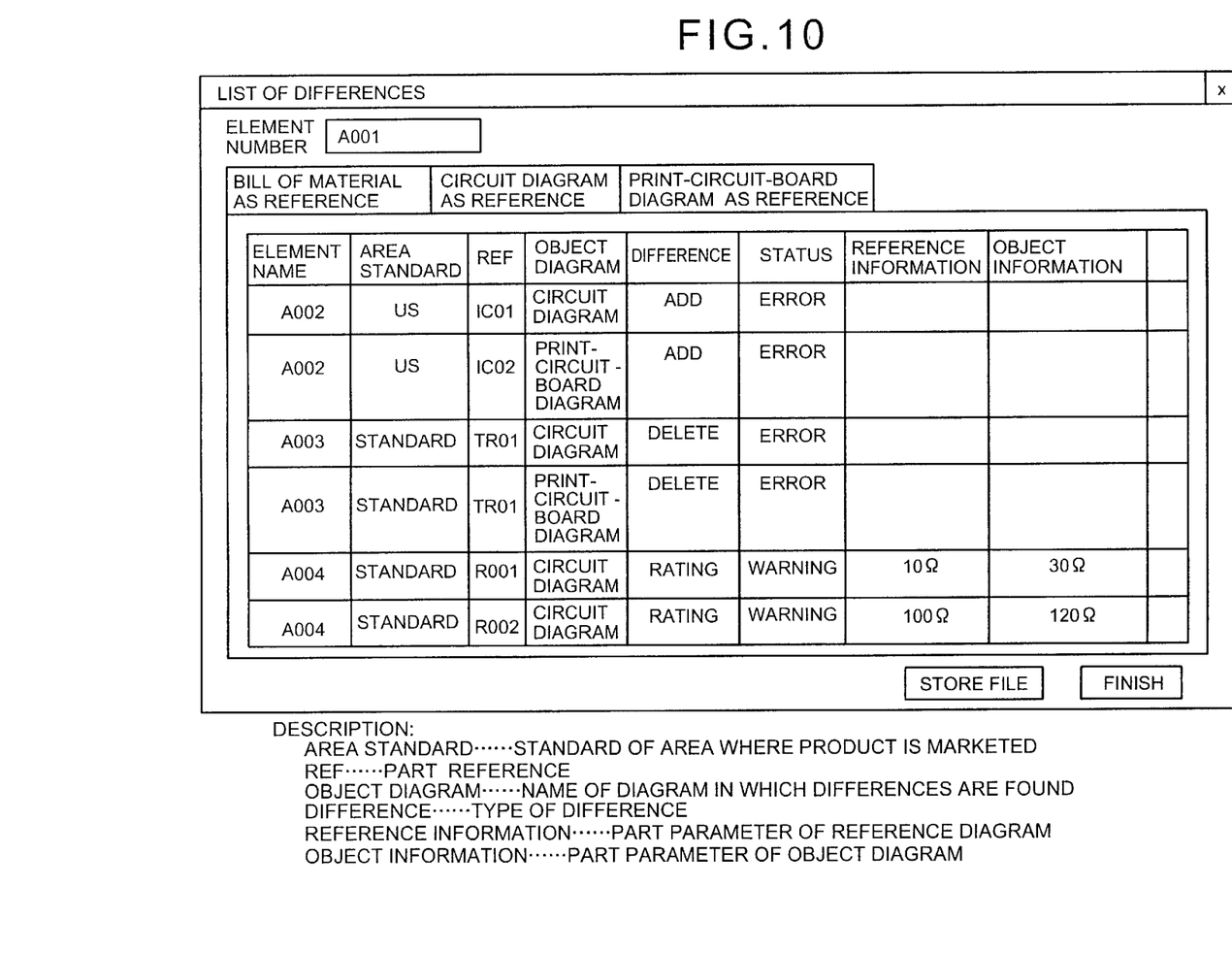
FIG. 10 is an illustrative drawing showing an example of displaying of matching results.

FIG. 10 is an illustrative drawing showing an example of displaying of matching results.

Results of a matching process are displayed by using either one of the bill of material, the circuit diagram, and the print-circuit-board diagram as a reference, and is presented as a list of differences (inconsistencies). FIG. 10 shows a list of differences obtained by using the bill of material as a reference. A button for a circuit-diagram reference or a print-circuit-board-diagram reference may be operated to display a list of differences obtained by using a corresponding diagram as a reference. In FIG. 10, the status field indicates either "error" or "warning" according to the matching rules of the matching-rule storage unit 8 as shown in FIG. 3B. A brief description of each field is given at the bottom of FIG. 10.

Figure 11:
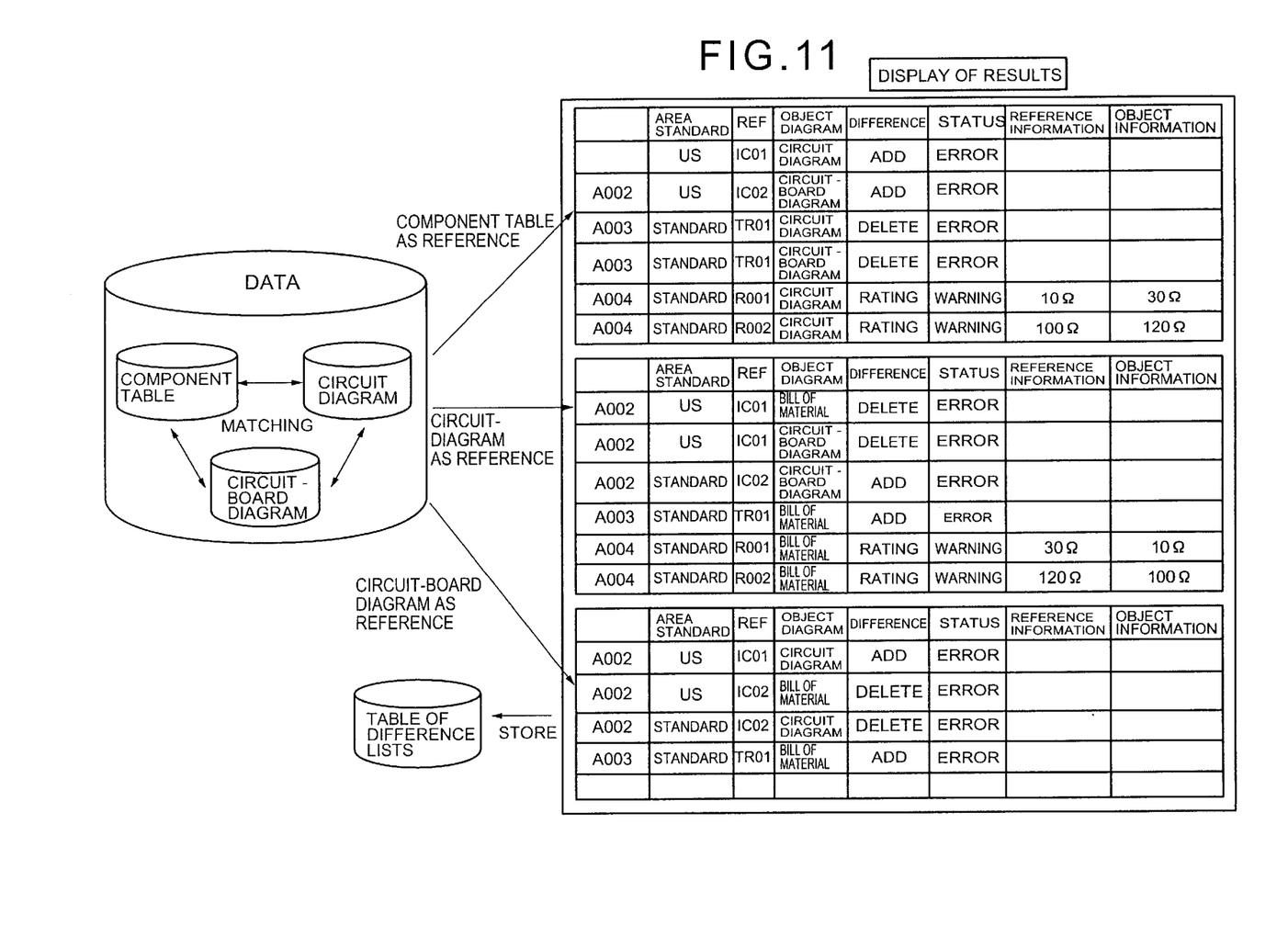
FIG. 11 is an illustrative drawing showing lists of differences each obtained by using a corresponding one of a bill of material, a circuit diagram, and a print-circuit-board diagram as a reference.

FIG. 11 is an illustrative drawing showing lists of differences each obtained by using a corresponding one of the bill of material, the circuit diagram, and the print-circuit-board diagram as a reference. Components in the database are matched according to the flowchart of FIG. 9 by using one of the bill of material, the circuit diagram, and the print-circuit-board diagram as a reference, and lists of differences as shown in FIG. 11 are obtained with respect to respective references. In each list, the status field, for example, indicates either "error" or "warning" according to the matching rules stored in the matching-rule storage unit 8. The lists of differences are stored as data indicative of inconsistencies of parts.

FIGS. 12A through 12D are illustrative drawings showing examples of matching-result presentation.

FIGS. 12A through 12D relate to a first A pattern which presents a tree structure.

Figure 12A:
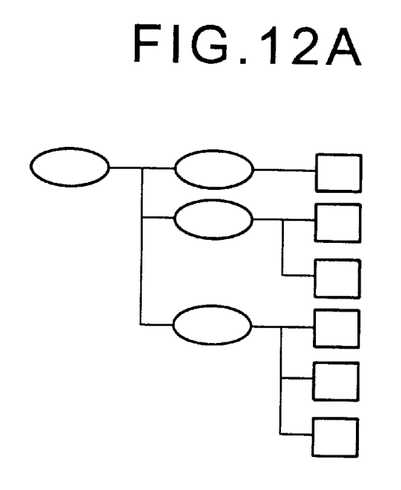
FIGS. 12A through 12D are illustrative drawings showing examples of matching-result presentation.

FIG. 12A illustrates a case where no difference (no inconsistency) is present. No node of the tree is highlighted with enhanced appearance.

Figure 12B:
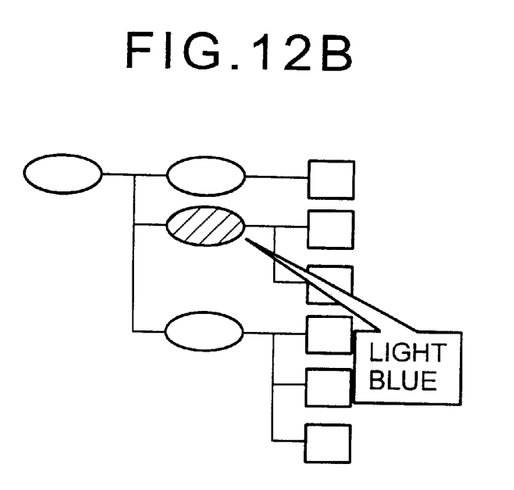

FIG. 12B shows an initial state where no matching is conducted yet. In this case, a selected node is shown with enhanced appearance using a color of light blue.

Figures 12C, 12D:
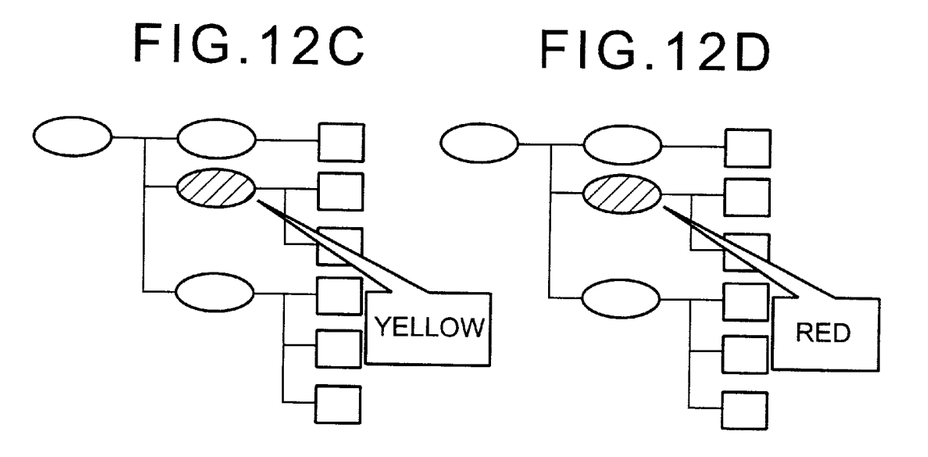

FIG. 12C exhibits a case where warning is detected. In this case, a node for which matching finds inconsistency is highlighted by using a color of yellow.

FIG. 12D shows a case in which error is detected. In this case, a node for which matching finds inconsistency is shown in red, highlighting the inconsistency from the rest.

In this manner, a node having inconsistency is displayed with highlighted appearance in order to indicate warning or error based on the matching process. This allows an easy visual spotting of an inconsistent node.

Figure 13A:
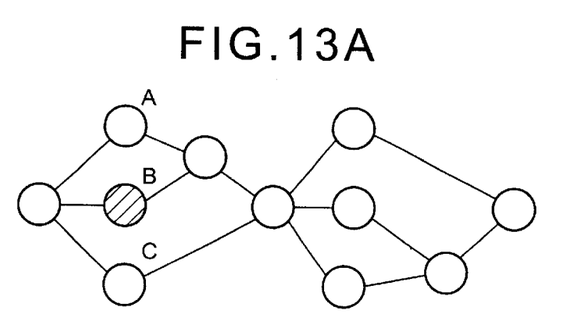
FIGS. 13A and 13B are illustrative drawings showing another set of examples of matching-result presentation.
Figure 13B:
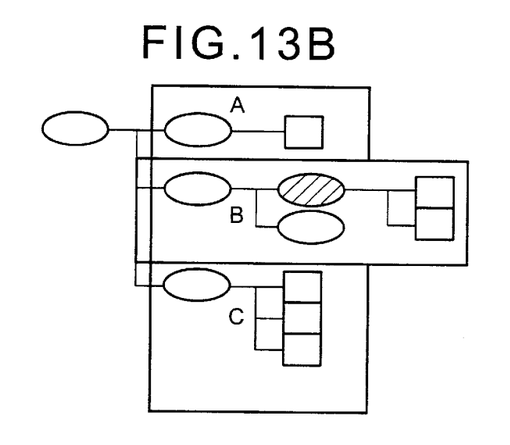

FIGS. 13A and 13B are illustrative drawings showing another set of examples of matching-result presentation.

FIGS. 13A and 13B relate to a second pattern which presents a window of project-management utility.

In this second pattern, when there are items having different statuses as a result of a matching process, a color corresponding to the most serious error level is displayed in the project-management utility as shown in FIG. 13A. When a tree structure such as that shown in FIG. 13B is referred to from the project-management utility of FIG. 13A, a logic product (AND) of structure-information statuses is displayed with respect to all nodes belonging to indicated elements. Here, lists of differences may be shown as a logic sum.

Figure 14:
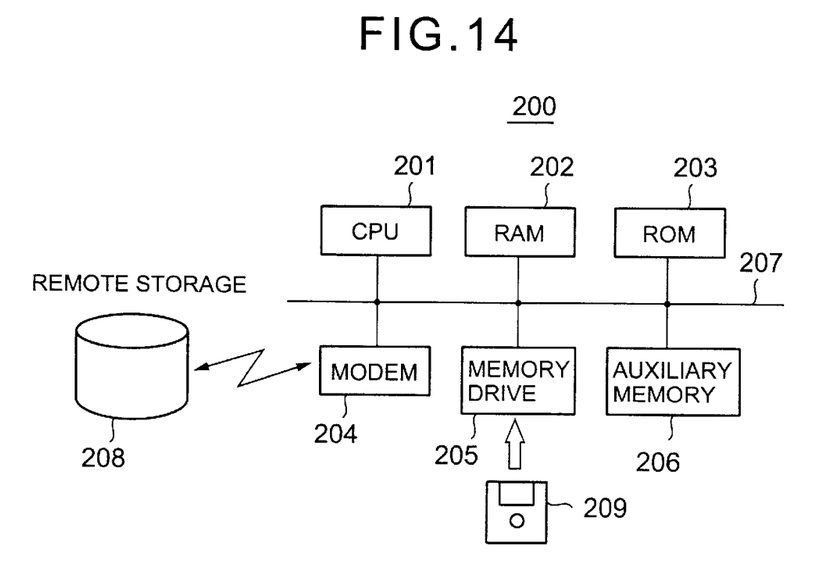
FIG. 14 is an illustrative drawing showing an example of a computer which implements the system of FIG. 1.

FIG. 14 is an illustrative drawing showing an example of a computer which implements the system of FIG. 1.

A computer 200 of FIG. 14 includes a CPU 201, a RAM 202, a ROM 203, a MODEM 204, a memory drive 205, an auxiliary memory 206, and a bus 207 connecting these elements together.

A program for implementing the present invention is stored in a remote storage 208 connected to the modem 204 via a communication line, and/or is stored in a memory medium 209 such as a floppy disk, a CD-ROM, a memory card, or the like. The program is loaded to the computer 200 from the remote storage 208 via the modem 204 or from the memory medium 209 via the memory drive 205. The loaded program may be stored in the auxiliary memory 206 for subsequent loading to the RAM 202, or may be directly stored in the RAM 202.

The CPU 201 executes the program stored in the RAM 202 by using an available memory space of the RAM 202 as its work area, and performs the functions of the definition unit 2, the tree generation unit 3, the matching unit 4, the result-display unit 5, and the correction unit 6 shown in FIG. 1. The auxiliary memory 106 serves as the matching-mask storage unit 7, the matching-rule storage unit 8, the circuit-diagram storage unit 9, the print-circuit-board-diagram storage unit 10, and the bill-of-material storage unit 11. Further, the ROM 203 stores programs therein for controlling basic operations of the computer 200.

In this manner, the present invention generates a tree from a circuit diagram, a print-circuit-board diagram, and a bill of material, and performs a matching process with respect to a range relating to an indicated node in the tree by using as a reference the circuit diagram, the print-circuit-board diagram, or the bill of material. The matching process may be repeated after modifications are made. After the matching process, inconsistencies found by the process are presented, allowing corrections to be made. The matching process may be repeated again after the correction of inconsistencies, thereby helping to produce consistent diagrams and table.

Further, the present invention is not limited to these embodiments, but various variations and modifications may be made without departing from the scope of the present invention.

What is claimed is:

1. A device for matching information between a plurality of circuitry-related documents, comprising:

a tree generation unit generating a tree that represents relations between the plurality of circuitry-related documents;

a matching-mask storage unit storing a matching mask that specifies matching objects; and a matching unit matching the matching objects between the plurality of circuitry-related documents within a specified range in the tree, wherein the matching of the matching objects is performed by successively selecting one of the plurality of circuitry-related documents as a reference to be compared with others of the plurality of circuitry-related documents so as to obtain a plurality of lists of differences for respective references.

2. The device as claimed in claim 1, wherein the circuitry-related documents include a circuit diagram, a print-circuit-board diagram, and a bill of material.

3. The device as claimed in claim 2, wherein the specified range is a range in which all diagrams necessary for a complete circuitry are contained when the circuitry is indicated by selection of a node in the tree.

4. The device as claimed in claim 1, further comprising a matching-rule storage unit storing matching rules that defines items of the matching objects and levels of significance of the respective items, wherein said matching unit matches the matching objects according to the matching rules.

5. The device of claim 4, wherein the levels of significance comprise a higher level and a lower level, wherein inconsistency of the higher level results in an error, and wherein inconsistency of the lower level results in a warning.

6. The device as claimed in claim 1, further comprising:

a result-display unit displaying inconsistencies of the matching objects as results of the matching; and a correction unit arranging another matching and displaying after correction of the inconsistencies.

7. The device of claim 6, wherein the result-display unit displays the plurality of lists of inconsistencies as a plurality of tree structures, each of the plurality of tree structures containing a plurality of nodes, and wherein the inconsistencies are displayed as colored nodes.

8. A method of matching information between a plurality of circuitry-related documents, comprising:

storing a matching mask that specifies matching objects;

generating a tree that represents relations between the plurality of circuitry-related documents; and matching the matching objects between the plurality of circuitry-related documents within a specified range in the tree by successively selecting one of the plurality of circuitry-related documents as a reference to be compared with others of the plurality of circuitry-related documents so as to obtain a plurality of lists of differences for respective references.

9. The method as claimed in claim 8, wherein the circuitry-related documents include a circuit diagram, a print-circuit-board diagram, and a bill of material.

10. The method as claimed in claim 7, further comprising defining the specified range by selecting a range that contains therein all diagrams necessary for a complete circuitry when the circuitry is indicated by selection of a node in the tree.

11. The method of claim 8, further comprising:

storing matching rules that define items of the matching objects and levels of significance of the respective items; and matching the matching objects according to the matching rules.

12. A computer-readable medium having a program embodied therein for causing a computer to match information between a plurality of circuitry-related documents, said program comprising:

a code unit configured to store a matching mask that specifies matching objects;

a code unit configured to generate a tree that represents relations between the plurality of circuitry-related documents; and a code unit configured to match the matching objects between the plurality of circuitry-related documents within a specified range in the tree, wherein the matching of the plurality of matching objects is performed by successively selecting one of the plurality of circuitry-related documents as a reference to be compared with others of the plurality of circuitry-related documents so as to obtain a plurality of lists of differences for respective references.

13. The computer-readable medium as claimed in claim 12, wherein the circuitry-related documents include a circuit diagram, a print-circuit-board diagram, and a bill of material.

14. The computer-readable medium as claimed in claim 13, wherein said program further includes a code unit configured to define the specified range by selecting a range that contains therein all diagrams necessary for a complete circuitry when the circuitry is indicated by selection of a node in the tree.

15. The computer-readable medium of claim 12, further comprising a matching-rule storage unit which stores matching rules that defines items of the matching objects and levels of significance of the respective items, wherein said matching unit matches the matching objects according to the matching rules.

* * * * *